(12) United States Patent
Miller et al.

(10) Patent No.: US 11,300,988 B2
(45) Date of Patent: Apr. 12, 2022

(54) METHOD AND SYSTEM TO BOOST BATTERY VOLTAGE

(71) Applicant: Battery Savers Inc., Castro Valley, CA (US)

(72) Inventors: Andrew J. Miller, College Station, TX (US); Mitchell Kirschner, Bal Harbour, FL (US)

(73) Assignee: Battery Savers Inc., Santa Rosa, CA (US)

( * ) Notice: Subject to any disclaimer, the term of this patent is extended or adjusted under 35 U.S.C. 154(b) by 116 days.

(21) Appl. No.: 16/534,962

(22) Filed: Aug. 7, 2019

(65) Prior Publication Data
US 2020/0050226 A1  Feb. 13, 2020

Related U.S. Application Data

(60) Provisional application No. 62/715,604, filed on Aug. 7, 2018.

(51) Int. Cl.
| | |
|---|---|
| *H02M 3/155* | (2006.01) |
| *H02M 3/158* | (2006.01) |
| *H02M 3/156* | (2006.01) |
| *G05F 1/62* | (2006.01) |
| *H02J 7/00* | (2006.01) |
| *H03K 17/56* | (2006.01) |

(52) U.S. Cl.
CPC .............. *G05F 1/62* (2013.01); *H02J 7/0072* (2013.01); *H03K 17/56* (2013.01); *H02M 3/155* (2013.01); *H02M 3/156* (2013.01); *H02M 3/1582* (2013.01)

(58) Field of Classification Search
CPC ...... H02M 3/155; H02M 3/156; H02M 3/158; H02M 3/1582
USPC .................................................... 363/60, 124
See application file for complete search history.

(56) References Cited

U.S. PATENT DOCUMENTS

| | | | | |
|---|---|---|---|---|
| 4,310,785 | A | * | 1/1982 | Iwata ..................... G03B 15/05 |
| | | | | 315/171 |
| 4,499,525 | A | * | 2/1985 | Mallory ............... H05B 39/047 |
| | | | | 362/157 |
| 5,489,870 | A | | 2/1996 | Arakawa |
| 5,521,547 | A | | 5/1996 | Tsukada |
| | | | | (Continued) |

FOREIGN PATENT DOCUMENTS

EP    1410396    11/2004

*Primary Examiner* — Gary A Nash
(74) *Attorney, Agent, or Firm* — Peacock Law P.C.; Justin R. Jackson; Deborah A. Peacock

(57) ABSTRACT

A voltage boosting method, system, and circuit which can be incorporated into a battery or device or can be added as a circuit that interfaces between a battery and a device. Optionally, the voltage boosting system can be added without requiring the battery or the device to be modified. The voltage boosting circuit incorporates a pair of transformers and does not require a step-up transformer, thus enabling the circuit to be constructed in a compact form, optionally within a single integrated circuit package. One or more mechanical or automatic switches can be provided which enable the voltage boosting circuit to be disconnected from the battery and the load until such time as the voltage of the battery or battery bank falls below a predetermined amount, at which time the one or more switches can be activated, thus engaging the voltage boosting circuit.

33 Claims, 15 Drawing Sheets

(56) References Cited

U.S. PATENT DOCUMENTS

| | | | |
|---|---|---|---|
| 5,821,697 A * | 10/1998 | Weber | H05B 39/09 |
| | | | 315/200 A |
| 5,975,058 A * | 11/1999 | French | F02D 41/062 |
| | | | 123/179.16 |
| 5,982,604 A * | 11/1999 | Kojima | H02M 3/1563 |
| | | | 361/159 |
| 5,994,882 A * | 11/1999 | Ma | H02M 3/1588 |
| | | | 323/222 |
| 6,040,660 A | 3/2000 | Schmidt et al. | |
| 6,040,686 A * | 3/2000 | Schenkel | H02M 3/156 |
| | | | 323/282 |
| 6,246,184 B1 | 6/2001 | Salerno | |
| 6,535,424 B2 | 3/2003 | Le et al. | |
| 6,841,941 B2 | 1/2005 | Kim et al. | |
| 6,952,084 B2 | 10/2005 | Bruwer | |
| 7,116,061 B2 | 10/2006 | Kim et al. | |
| 7,123,078 B2 | 10/2006 | Seo | |
| 7,214,952 B2 | 5/2007 | Klipstein et al. | |
| 8,436,592 B2 | 5/2013 | Saitoh | |
| 8,729,957 B2 | 5/2014 | Deam | |
| 10,008,872 B2 | 6/2018 | Roohparvar et al. | |
| 2001/0022735 A1 * | 9/2001 | Zanuccoli | H02M 3/073 |
| | | | 363/60 |
| 2003/0142518 A1 | 7/2003 | Cheng | |
| 2005/0047181 A1 | 3/2005 | Yamamoto et al. | |
| 2007/0052387 A1 * | 3/2007 | Yen | H02J 7/342 |
| | | | 320/109 |
| 2008/0238369 A1 | 10/2008 | Cintra et al. | |
| 2012/0121943 A1 | 5/2012 | Roohparvar | |
| 2012/0236551 A1 * | 9/2012 | Sharrah | H05B 31/50 |
| | | | 362/204 |
| 2012/0256561 A1 * | 10/2012 | Kwon | H05B 45/37 |
| | | | 315/307 |
| 2012/0326632 A1 * | 12/2012 | Kitagawa | H05B 45/37 |
| | | | 315/307 |
| 2014/0084843 A1 | 3/2014 | Pham et al. | |
| 2015/0048785 A1 | 2/2015 | Roohparvar et al. | |
| 2015/0056476 A1 | 2/2015 | Roohparvar et al. | |
| 2015/0072181 A1 | 3/2015 | Roohparvar | |
| 2015/0171745 A1 * | 6/2015 | Smith | H01M 6/50 |
| | | | 323/311 |
| 2019/0115630 A1 | 4/2019 | Roohparvar et al. | |
| 2019/0165593 A1 | 5/2019 | Roohparvar et al. | |

* cited by examiner

METHOD AND SYSTEM TO BOOST BATTERY VOLTAGE

CROSS-REFERENCE TO RELATED APPLICATIONS

This application claims priority to and the benefit of the filing of U.S. Provisional Patent Application No. 62/715,604, entitled "Electronic Circuits and Systems to Extend Battery Lifetime", filed on Aug. 7, 2018, and the specification thereof is incorporated herein by reference.

BACKGROUND OF THE INVENTION

Embodiments of the present invention relate to circuits and systems that boost a voltage source for direct-current ("DC") operated devices.

DC electronic components require a minimum voltage in order to operate correctly. If the required voltage is not met, the electronic device may function incorrectly or not at all. In the case of battery-operated devices, the device is inoperable if the voltage supply from a battery source drops below that required minimum. In many of these devices, using a voltage boosting circuit in the correct place can allow for a number of benefits including increased battery life/capacity, allow the use of alternative lower than normal voltage sources, and provide higher voltages from a lower voltage source.

BRIEF SUMMARY OF EMBODIMENTS OF THE PRESENT INVENTION

Embodiments of the present invention relate to a battery voltage boosting system including a switch configured to connect a voltage boosting circuit to a battery, the voltage boosting circuit including a collector of a PNP transistor coupled to a base of an NPN transistor, a collector of the NPN transistor coupled to the battery through an inductor when the switch is positioned to connect the voltage boosting circuit to the battery, and the collector of the NPN transistor coupled to an emitter of the PNP transistor through a resistor and a diode. The switch can be configured to automatically connect the voltage boosting circuit to the battery based on an output voltage of the battery. The voltage boosting circuit can also include a capacitor and a Zener diode in parallel with a load when the switch is positioned to connect the voltage boosting circuit to the battery. The voltage boosting circuit can also include a germanium diode in series with the load, the capacitor and the Zener diode when the switch is positioned to connect the voltage boosting circuit to the battery. The voltage boosting circuit can include a plurality of the voltage boosting circuits and the plurality of voltage boosting circuits can be arranged in parallel with one another. Optionally, the voltage boosting circuit can also include a plurality of the voltage boosting circuits and the plurality of voltage boosting circuits can be connected such that one of the plurality of voltage boosting circuits is connected to cascade in series with another of the plurality of voltage boosting circuits.

In one embodiment, the voltage boosting circuit does not include a transformer. Optionally, the voltage boosting circuit can be connected to a battery clip. The battery clip can be a clip that interfaces between a battery and an input terminal for an electrical or electronic device. Optionally, the battery clip can include a 9-volt ("9V") battery clip. In one embodiment, the voltage boosting system can be disposed within a housing of a battery.

Embodiments of the present invention also relate to a battery voltage boosting system that includes a switch configured to connect a voltage boosting circuit to a battery. The voltage boosting circuit can include a collector of a PNP transistor coupled to a base of an NPN transistor; a collector of the NPN transistor coupled to the battery through an inductor when the switch is positioned to connect the voltage boosting circuit to the battery; and a collector of the NPN transistor coupled to an emitter of the PNP transistor through a resistor and through the inductor. The inductor can be electrically disconnected from the battery when the switch is positioned to disconnect the voltage boosting circuit from the battery. The switch can be configured to automatically connect the voltage boosting circuit to the battery based on an output voltage of the battery. In one embodiment, the voltage boosting circuit can include a capacitor and a Zener diode in parallel with a load when the switch is positioned to connect the voltage boosting circuit to the battery.

Embodiments of the present invention also relate to a battery voltage boosting system including a switch configured to connect a voltage boosting circuit to a battery; the voltage boosting circuit disposed in a disc-shaped housing; and the voltage boosting circuit comprising a conductive tab extending from an outer circumference of the disc-shaped housing, the conductive tab comprising a terminal connector of the voltage boosting circuit. The conductive tab can include a negative terminal connector of the voltage boosting circuit. Optionally, the conductive tab can be electrically coupled to an emitter of an NPN transistor without any intervening electronic components. In one embodiment, the conductive tab can include a positive terminal connector of the voltage boosting circuit. The disc-shaped housing can have a diameter not greater than that of one or more of a AAA-size battery, a AA-size battery, a C-size battery, and a D-size battery.

Embodiments of the present invention also relate to a method for boosting a battery voltage including sensing an output voltage of a battery, activating a switch if the output voltage of the battery falls below a predetermined amount, boosting voltage by passing current through an inductor and through a collector and an emitter of the NPN transistor when the switch is activated, and controlling the NPN transistor by adjusting a voltage applied to the base of the NPN transistor from a collector of a PNP transistor. Sensing an output voltage of the battery and activating a switch can be accomplished electronically. In one embodiment, boosting voltage does not comprise boosting voltage via a transformer. Optionally, the method can include boosting voltage by cascading an output of a first voltage boosting circuit into the input of a second voltage boosting circuit. The method can include extending life of the battery by boosting a remaining unused energy of the battery that otherwise would not be useable.

Embodiments of the present invention also relate to a method for starting a combustion engine vehicle with a depleted battery, the method including connecting positive and negative input terminals of a voltage boosting circuit to respective positive and negative terminals of the depleted battery; connecting electrical inputs of the combustion engine vehicle to electrical outputs of the voltage boosting circuit; and boosting voltage of the depleted battery with the voltage boosting circuit to at least an amount sufficient to start the combustion engine vehicle.

Embodiments of the present invention also relate to a battery voltage boosting system including a housing; positive and negative input terminals; positive and negative output terminals, the positive and negative input terminals projecting from a first side of the housing; the positive and negative output terminals projecting from a second side of the housing; the first side of the housing and the second side of the housing comprising opposite sides of the housing; and a battery voltage boosting circuit disposed within the housing and communicably coupled to the positive and negative input terminals and the positive and negative output terminals; the positive and negative input terminals positioned such that when attached to positive and negative battery terminals of a depleted combustion engine vehicle battery, the battery voltage boosting circuit boosts voltage of the combustion engine vehicle battery to a level sufficient to cause the combustion engine vehicle to be started. The positive input terminal can be communicably coupled to the positive battery terminal of the combustion engine vehicle battery and the negative input terminal can be communicably coupled to the negative battery terminal of the combustion engine vehicle battery.

In one embodiment of the present invention, a system to extend battery lifetime comprises a first voltage boosting circuit for operation with a low voltage source, a second circuit for operating with the low voltage source without the voltage boosting circuit, and circuit selector switches for selectively connecting an electrical load. In one embodiment, the circuit selector switches comprise a third circuit which automatically senses the voltage of the voltage source and selectively switches between the first or the second circuit based on a predetermined voltage. In another embodiment, the circuit selector switches are controlled by logic to determine when to switch between the first or the second circuit.

In one embodiment, a voltage boosting circuit comprises an NPN-type transistor, a PNP-type transistor, an inductor, two different capacitors, two different resistors, and a diode. In this embodiment, the system allows for a higher current drain from the one or more battery cells and has a higher corresponding power output. This embodiment of the invention can be applied to higher current applications including devices with motors or display screens including cell phones, laptops, drones, car batteries, and electric vehicles. This embodiment also has the potential to have a smaller circuit footprint than other boosting circuits by being manufactured, for example, as a single microchip package, which in turn has the potential to reduce manufacturing costs.

Embodiments of the present invention incorporate a voltage boosting circuit into devices including but not limited to flashlights, smoke detectors, cell phones, laptops, tablets, unattended ground sensors (UGS), radios, battery operated toys, mp3 players, two way radios, wireless electronics including keyboards and mice, game controllers, cars, motorcycles, remote controllers, drones, electric vehicles, combustion engine vehicles (CEV), space vehicles, batteries themselves, portable chargers, internet of things (IOT) devices, implanted medical devices (e.g., pacemakers, defibrillators, sensors, etc.), circuits requiring multiple voltage level sources, etc., and renewable energy sources including solar, wind, water, etc., to boost a given voltage source's output to a higher voltage when needed, and in energy storage systems and grids.

Embodiments of the invention can include, in one embodiment, a simple and inexpensive circuit, which can be incorporated into DC operated devices, allowing a voltage source to be boosted to a higher voltage. This type of circuit preferably takes a low voltage source, which as an example could be the residual energy contained in batteries that are otherwise regarded as "dead batteries", steps it up to a higher voltage using, for example, an inductor to store energy and then discharges a higher voltage pulse to the DC operated device needing power, doing this several hundred to several hundred thousand times a second by using transistors as fast switches. The high frequency pulsing is sufficient to power many devices, but if necessary, appropriate capacitance and voltage regulators can be added to the output of the voltage boosting circuit to provide a more constant voltage output. In the case of incorporating embodiments of the invention to boost the voltage of a "dead battery", the user can drain the last amount of energy from the battery and use it to power a device. This is energy that would otherwise be wasted, thereby extending the battery life and/or increasing the battery's useable energy capacity. Embodiments of the invention for voltage boost circuits are relatively inexpensive for individual voltage sources, costing pennies to retrofit in existing devices when produced in bulk, and thus, when used to extend the useful life of batteries, they pay for themselves through the energy recovered within the first set of batteries.

In one embodiment, a voltage boosting circuit comprises an NPN-type transistor, a PNP-type transistor, an inductor, a capacitor, two different resistors, and a diode. This embodiment of the invention can be applied to higher current applications including but not limited to devices with motors or display screens including cell phones, laptops, drones, car batteries, and electric vehicles. This embodiment has the ability to have a smaller circuit footprint than other boosting circuits by being manufactured, for example, as a single microchip package, which in turn has the ability to reduce manufacturing costs.

In one embodiment, a system to extend battery life comprises one or more battery cells, an electrical load, a first circuit for operation with the non-depleted battery, a second circuit for operation with the depleted battery cells using one or more voltage boosting circuits per one or more depleted battery cells, and a circuit selector switch for selectively connecting the battery to the electrical load with the first circuit or the second circuit. In a preferred embodiment, the battery cells, the first circuit, the second circuit, and the circuit selector are preferably enclosed within the standardized battery casing during the manufacturing of the battery cells. Optionally, the components are retrofitted into the casing of already manufactured battery cells.

In one embodiment, a system to extend battery life is configured to extend the battery life of a DC battery operated device. In a preferred embodiment, the system comprises a first circuit for operation with the non-depleted battery, a second circuit for operation with the depleted battery using a voltage boosting circuit, and a circuit selector switch for selectively connecting the battery to an electrical load with the first circuit or the second circuit. In this embodiment, the system is preferably housed inside the battery connector permanently attached to the electrical load or manufactured as part of the electrical load circuitry.

In a different embodiment, a system to extend battery life is configured to extend the battery life of a 9V battery. In a preferred embodiment, the system comprises a first circuit for operation with the non-depleted 9V battery, a second circuit for operation with the depleted 9V battery using a voltage boosting circuit, and a circuit selector switch for selectively connecting the 9V battery to an electrical load with the first circuit or the second circuit. In this embodiment, the system is preferably housed inside the 9V battery connector permanently attached to the electrical load or manufactured as part of the electrical load circuitry.

In one embodiment, the system is housed inside a two-sided 9V battery connector to retrofit existing 9V devices. In one embodiment, the system housed in a two-sided 9V battery comprises a first circuit for operation with the non-depleted battery, a second circuit for operation with the depleted battery using a voltage boosting circuit, and a circuit selector switch for selectively connecting the battery to an electrical load with the first circuit or the second circuit. The system can be housed in disc (or other) shaped connectors for other batteries, e.g., AA, AAA, standard car battery, etc. Optionally, the system can be configured to fit in a thin adaptor that is disposed on or over one or two or more terminals of one or more batteries. The adaptor housing the system can optionally connect magnetically to the batteries or to the device that uses the batteries. In one embodiment, the system comprises a first circuit for operation with the non-depleted battery, a second circuit for operation with the depleted battery using a voltage boosting circuit, and a circuit selector switch for selectively connecting the battery to an electrical load with the first circuit or the second circuit.

An embodiment of the present invention also relates to a system comprising a boosting circuit that is housed in a single microchip package, which can easily be integrated into an electrical device by being built into its circuit board. Optionally, the system can include the boosting circuit and circuit selector switches housed in a single microchip package, which can easily be integrated into an electrical device by being built into its circuit board.

A system to boost voltage can be configured to boost the voltage from a voltage source within a DC operated device. The system can comprise a first circuit for operation without a voltage boosting circuit, a second circuit for operation with a voltage boosting circuit, and a circuit selector switch for selectively connecting the voltage source to an electrical load with the first circuit or the second circuit.

In one embodiment, a boosting circuit can be used to allow a lower voltage battery to be used in an application which normally would require a higher voltage battery, when the lower voltage battery is more beneficial due to constraints including size, energy density, materials, cost, etc. This allows the electrical load (device) to be redesigned to operate with a lower voltage battery which has higher energy density because lower voltage batteries can store more energy than higher voltage batteries.

Optionally, a boosting circuit can be used to power a device using a lower voltage battery than is normally required; and/or can be used to boost a low voltage obtained from a renewable energy resource including solar, wind, water, combinations thereof and the like, to a useful voltage needed in a solar, wind, water, or other system. The boosting circuit can optionally be used to charge a battery with a lower voltage from a renewable energy system than is normally needed to charge the battery.

Optionally, a boosting circuit, according to an embodiment of the present invention, can be used to take a single voltage source and provide one or more additional different voltages to an electrical load, to use, for example, a 1.5V AA battery to provide both 1.5V and 3V simultaneously to an electrical device.

In one embodiment, a boosting circuit can be used to provide an alternative high voltage mode from an otherwise lower voltage power source, to use, for example a 1.5V source to provide both 1.5V and 9V to an electrical device (not only a battery) as a voltage boost mode. Optionally, a plurality of boosting circuits can be incorporated in systems comprising multi cell batteries, such that one or more boosting circuits per one or more battery cells is provided. This allows the boosting circuit to function with high cell count batteries including but not limited to those used in drones and electric vehicles. In one embodiment, a plurality of boosting circuits can be incorporated such that one or more boosting circuits feed into additional one or more boosting circuits to provide a higher voltage boost.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

In the following detailed description, numerous specific details are set forth in order to provide a thorough understanding of the embodiments of the invention. However, upon studying this application, it will be understood by one of ordinary skill in the art that the embodiments may be practiced without these specific details. For instance, well known operation or techniques may not be shown in detail. Technical and scientific terms used in this description have the same meaning as commonly understood to one of ordinary skill in the art to which this subject matter belongs.

As used throughout this application, the term "battery" or "battery cell" includes primary battery cells as well as secondary battery cells. The term "battery" can also include a plurality of batteries that are arranged in parallel and/or series with one another. The term "non-depleted batteries" is intended to include one or more batteries which contain sufficient energy to power a desired component without use of a voltage-increasing circuit. As used throughout this application the term "depleted batteries" and "depleted battery" is intended to include one or more batteries which do not contain sufficient energy to power a desired component unless a voltage-increasing circuit is used. As used throughout this application, the term "clip" in reference to a battery, means anything that can clip or attach by any other means onto a battery or that one or more batteries can be clipped into.

Embodiments of the present invention incorporate a voltage boosting circuit into devices that can include but are not limited to flashlights, smoke detectors, cell phones, laptops, tablets, unattended ground sensors (UGS), radios, battery operated toys, mp3 players, two way radios, wireless electronics like keyboards and mice, game controllers, electric vehicles (EV) and combustion engine vehicles (CEV) cars, motorcycles, remote controllers, drones, electric vehicles, space vehicles, batteries themselves, portable chargers, internet of things (IOT) devices, implanted medical devices (e.g., pacemakers, sensors, etc.), circuits requiring multiple voltage level sources, etc., and renewable energy sources including but not limited to solar, wind, water, etc., to boost a given voltage source's output to a higher voltage when needed and in energy storage systems and grids.

Figure 1:
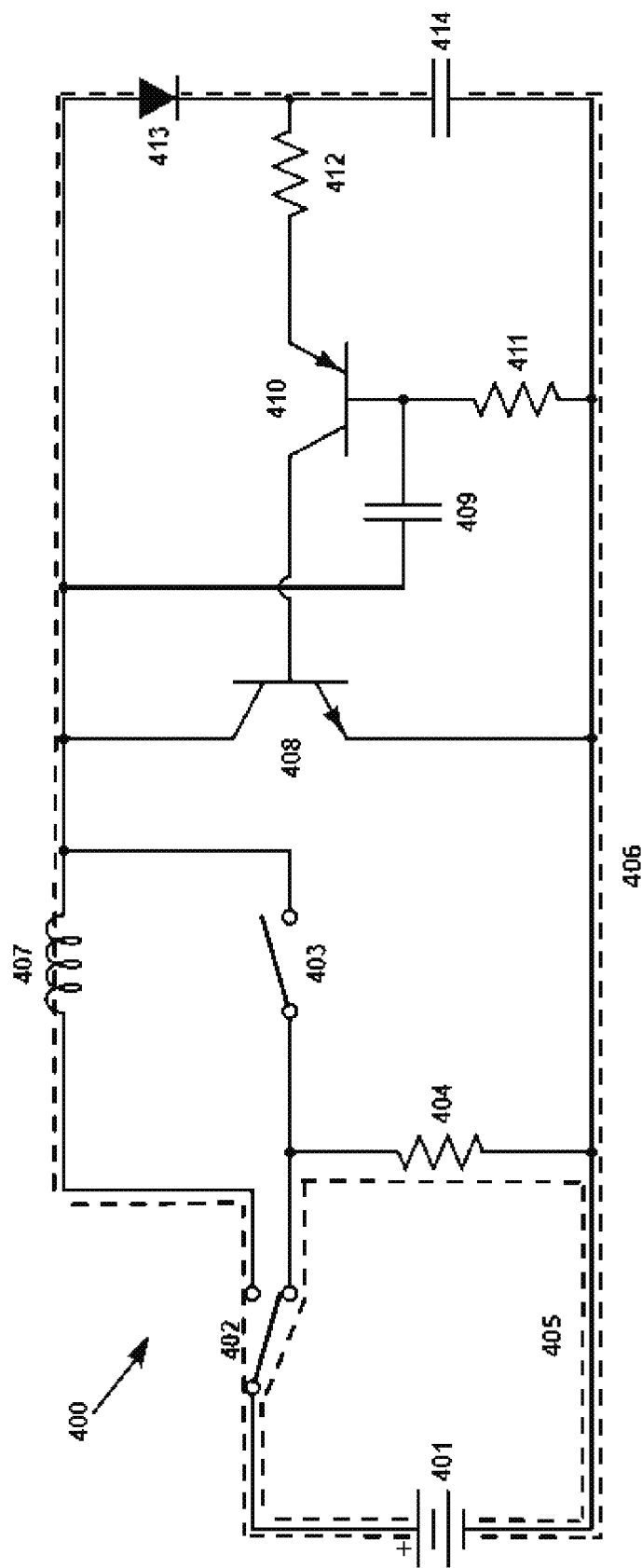
FIG. 1 is a circuit diagram of an embodiment of the invention for a circuit comprising an NPN-type transistor, a PNP-type transistor, an inductor, two capacitors, two resistors, and a diode.

Referring now to FIG. 1, in one embodiment, voltage boosting system 400 comprises an electronic circuit comprising one or more primary or secondary battery cells 401, electrical load 404, first circuit 405 for operation with the non-depleted primary or secondary battery, second circuit 406 for operation with the depleted primary or secondary battery cells using a voltage boosting circuit, and circuit selector switches 402 and 403 (or another component or circuit which accomplishes such switching) are preferably provided for selectively connecting primary or secondary battery cells 401 to electrical load 404 with either first circuit 405 or second circuit 406. In one embodiment second circuit 406 can include an NPN-type transistor 408, a PNP-type transistor 410, inductor 407, two capacitors, e.g., capacitor 409 and capacitor 414, two resistors, e.g., resistor 412 and resistor 411, and diode 413.

Figure 2:
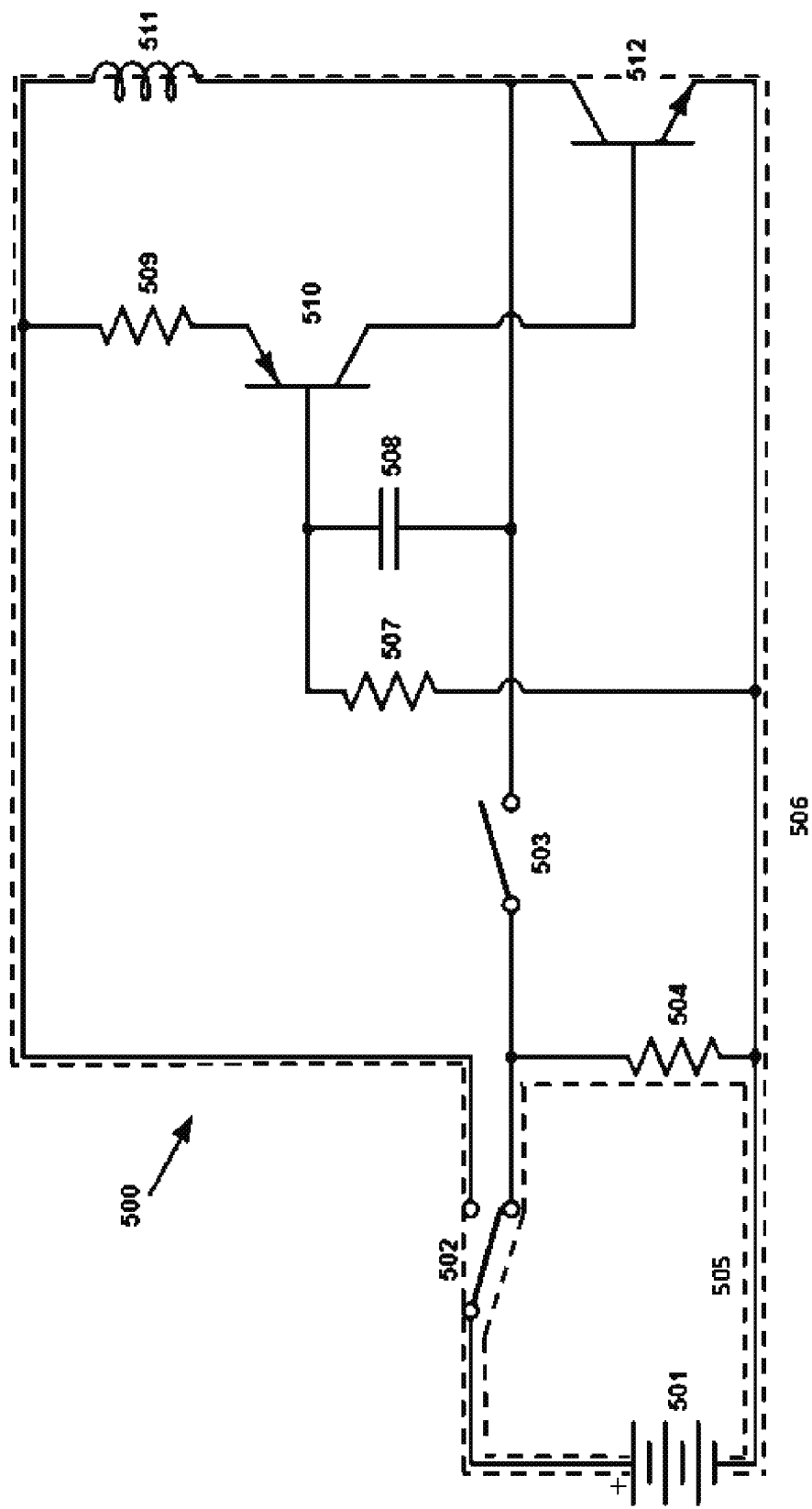
FIG. 2 is a circuit diagram of an embodiment of the invention for a circuit comprising an NPN-type transistor, a PNP-type transistor, an inductor, a capacitor, two resistors, and a diode.
Figure 10:
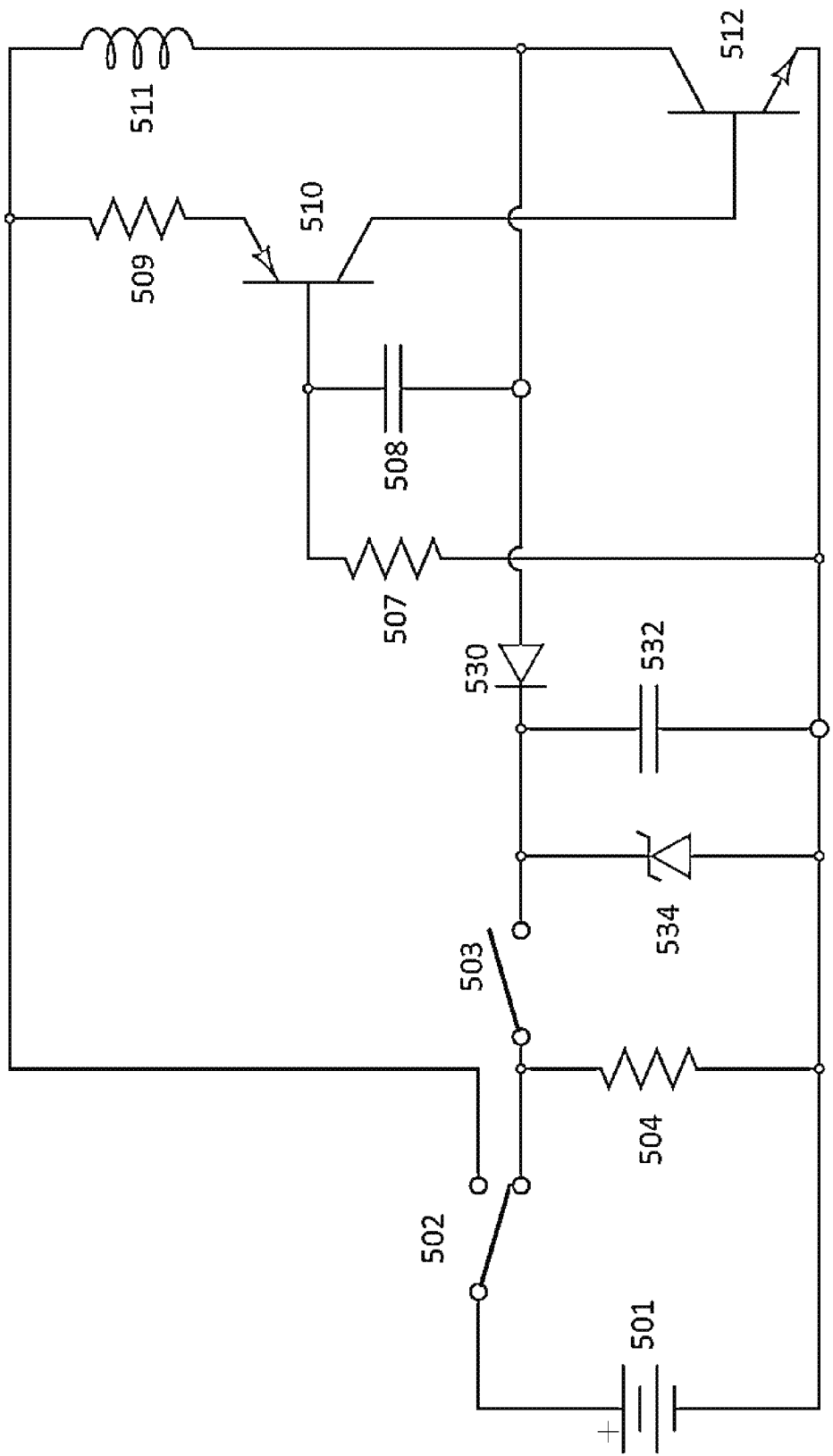
FIG. 10 is a circuit diagram which illustrates a wiring variant of the embodiment of FIG. 2 for a more constant power supply output.
Figure 11:
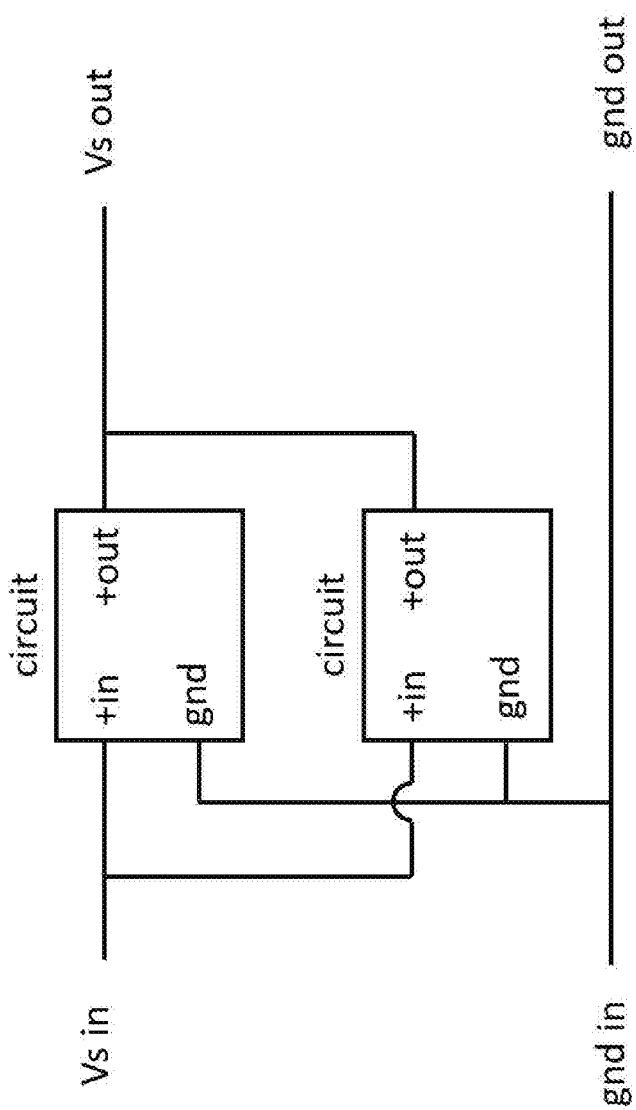
FIG. 11 is a circuit diagram which illustrates a plurality of voltage boosting circuits arranged in parallel with one another.
Figure 12:
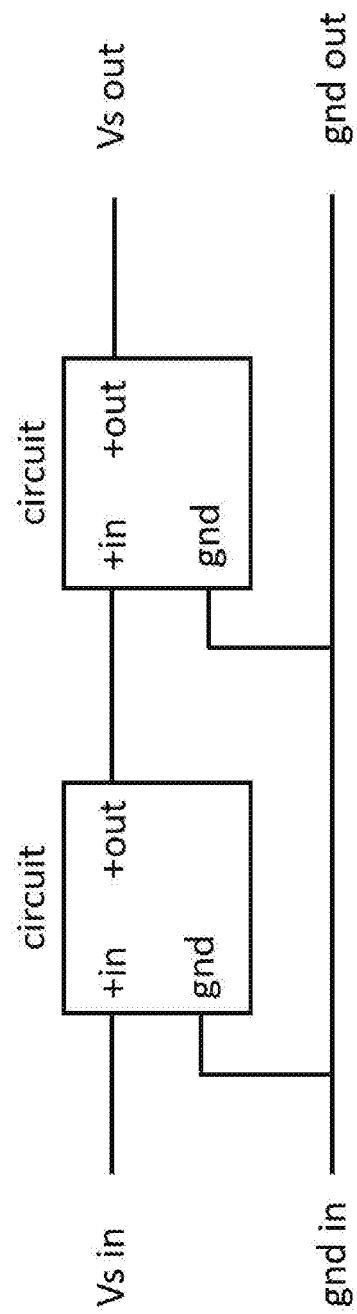
FIG. 12 is a circuit diagram which illustrates a plurality of voltage boosting circuits arranged in series with one another.

In one embodiment, the present invention comprises components that allow for simpler manufacturing, for example, by not requiring a dual-inductor transformer. Referring now to FIG. 2, in one embodiment, voltage boosting system 500 preferably comprises an electronic circuit having one or more primary or secondary battery cells 501, electrical load 504, first circuit 505 for operation with the non-depleted primary or secondary battery, second circuit 506 for operation with a depleted primary battery using a voltage boosting circuit, and circuit selector switches 502 and 503 for selectively connecting battery 501 to electrical load 504 with either first circuit 505 or second circuit 506. In one embodiment, circuit selector switches 502 and 503, which can optionally be packaged together, are preferably capable of being formed not only from conventional mechanical switches, but can also be formed from any other device, apparatus, circuit, system or method including but not limited to, those described previously. In one embodiment, second circuit 506 comprises NPN-type transistor 512, PNP-type transistor 510, inductor 511, capacitor 508, and two resistors, e.g., resistor 509 and resistor 507. As best illustrated in FIG. 10, one possible configuration comprises, for example, a germanium diode 530 (e.g., a 1N4001) placed between the boosting circuit's positive output and the positive input to the load, capacitor 532 (e.g., a 47 uF capacitor) placed in parallel with the load, and Zener diode 534 to regulate the voltage (e.g., a 1N5229 placed in parallel with the load).

In one embodiment, circuit selector switches 402 and 403 or 502 and 503, can optionally be packaged together and are preferably capable of being formed not only from conventional mechanical switches, but can also be formed from any other device, apparatus, circuit, system or method that is capable of starting, stopping, or changing a flow of electricity. This can include but is not limited to a microcontroller or other circuit that can be configured to allow a flow of electricity at a predetermined voltage; a silicon controlled rectifier (SCR) configuration of transistors to act as a sort of solid state relay to allow current through one path at high voltage, and then current through another path at the lower voltage, and/or a low voltage relay switch that runs a device, which can optionally include but is not limited to a flashlight, normally at high voltage or trigger and run only the voltage boosting circuit at lower voltage; a comparator chip used with a plurality of resistors and diodes to switch circuit paths based on the voltage; a simple battery-tester-circuit setup that powers either the device, which can optionally include but is not limited to a light-emitting diode (LED), normally or the voltage boosting circuit depending on the voltage of the battery; power relays; manual switches, combinations thereof, and the like. Thus, the activation of selector switches can optionally be accomplished automatically.

In one embodiment, a system to extend battery life comprises one or more primary or secondary battery cells, an electrical load, a first circuit for operation with the non-depleted battery, a second circuit for operation with the depleted battery using a voltage boosting circuit, and a circuit selector switch for selectively connecting the battery to the electrical load with the first circuit or the second circuit as discussed above. The embodiments for voltage boosting systems disclosed herein can work with other battery boosting circuits, including those taught in U.S. Pat. No. 9,441,799.

In one embodiment, a boosting circuit can be used to power a device of fewer batteries than are normally required to operate the device, for example, a device that normally requires three AA batteries, can operate with only one AA battery.

In one embodiment, a boosting circuit can be used to allow a lower voltage battery to be used in an application which normally would require a higher voltage battery, when the lower voltage battery is more beneficial due to constraints such as size, energy density, materials, cost, etc. This allows the electrical load (device) to be redesigned to operate with a lower voltage battery which has higher energy density because lower voltage batteries can store more energy than higher voltage batteries.

Figure 3:
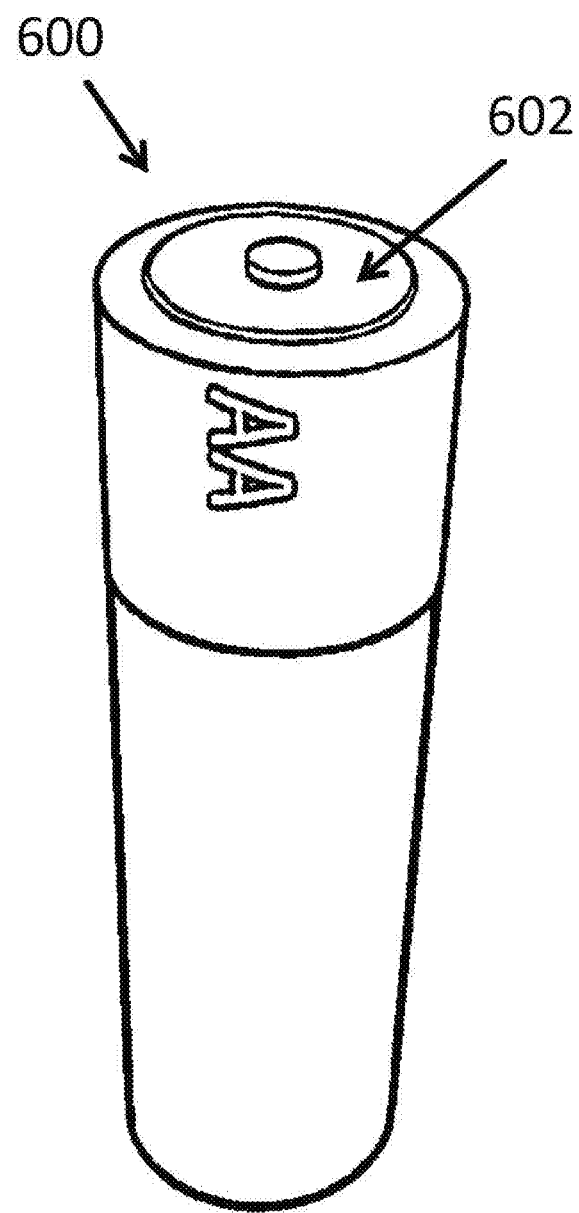
FIG. 3 is a drawing which illustrates a perspective view of a battery comprising an embodiment of a boosting circuit enclosed in its casing and wherein the terminal end of the boosting circuit comprises a cap having shape, size, and placement that corresponds to that of a positive terminal of an AA battery.
Figure 4:
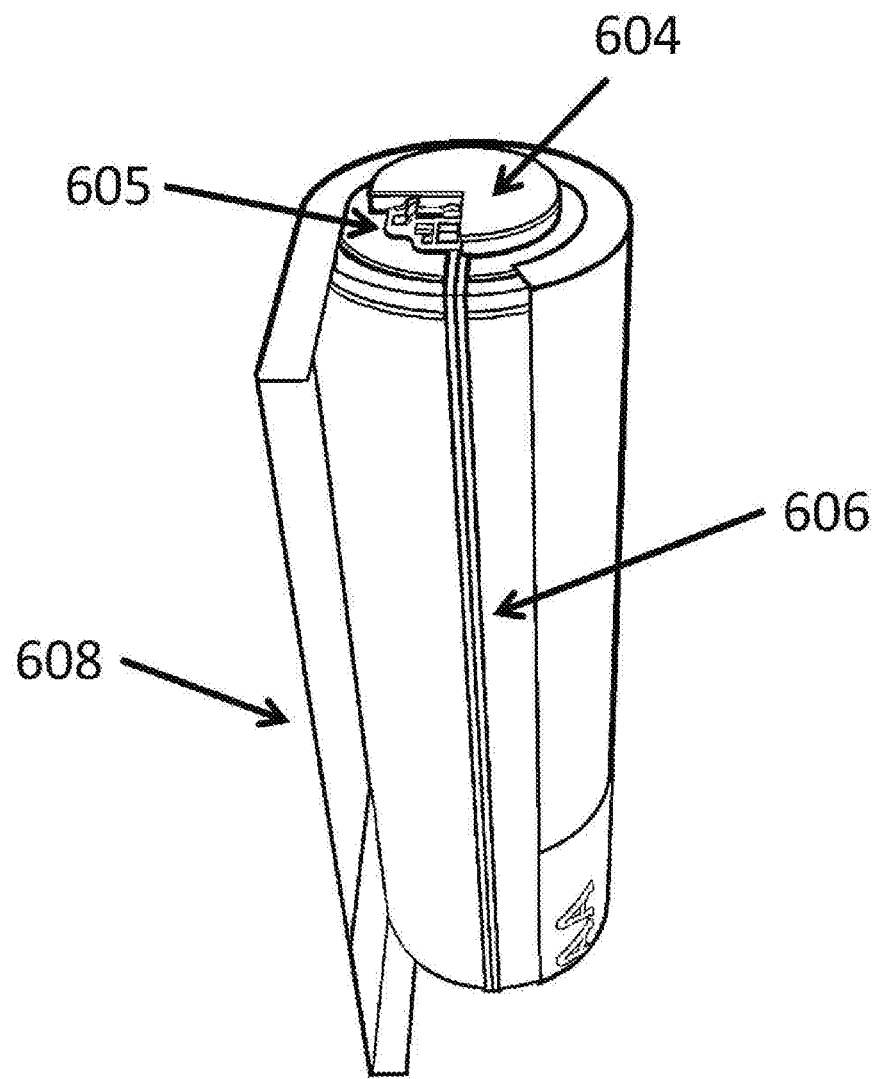
FIG. 4 is a drawing which illustrates a perspective view of the embodiment of FIG. 3 wherein a cap is shown that is disposed over the cathode of the battery that comprises components of a boosting circuit and a wire trace connecting the components of the anode and cathode for the embodiment of a boosting circuit system to operate.

In one embodiment, the first circuit, the second circuit, and the circuit selector switch(s) are preferably enclosed within a battery casing, which can include a standardized battery casing, during the manufacturing of the battery cells. Referring to FIGS. 3-4, in one embodiment, system 600 to extend battery life comprises caps 602 and 604 respectively disposed over the anode and cathode of a battery, and conductor 606 preferably connects system 600 to an opposite terminal of the battery from where system 600 is disposed. As illustrated in FIG. 4, in one embodiment, components 605 of the system for selectively boosting the voltage of the battery can be disposed within cap 604. In one embodiment, system 600 is added to the battery during its manufacture before its protective/insulating outer layer 608 of its housing is disposed over it. Optionally, the components can be retrofitted over the casing of already manufactured battery cells.

Figure 5:
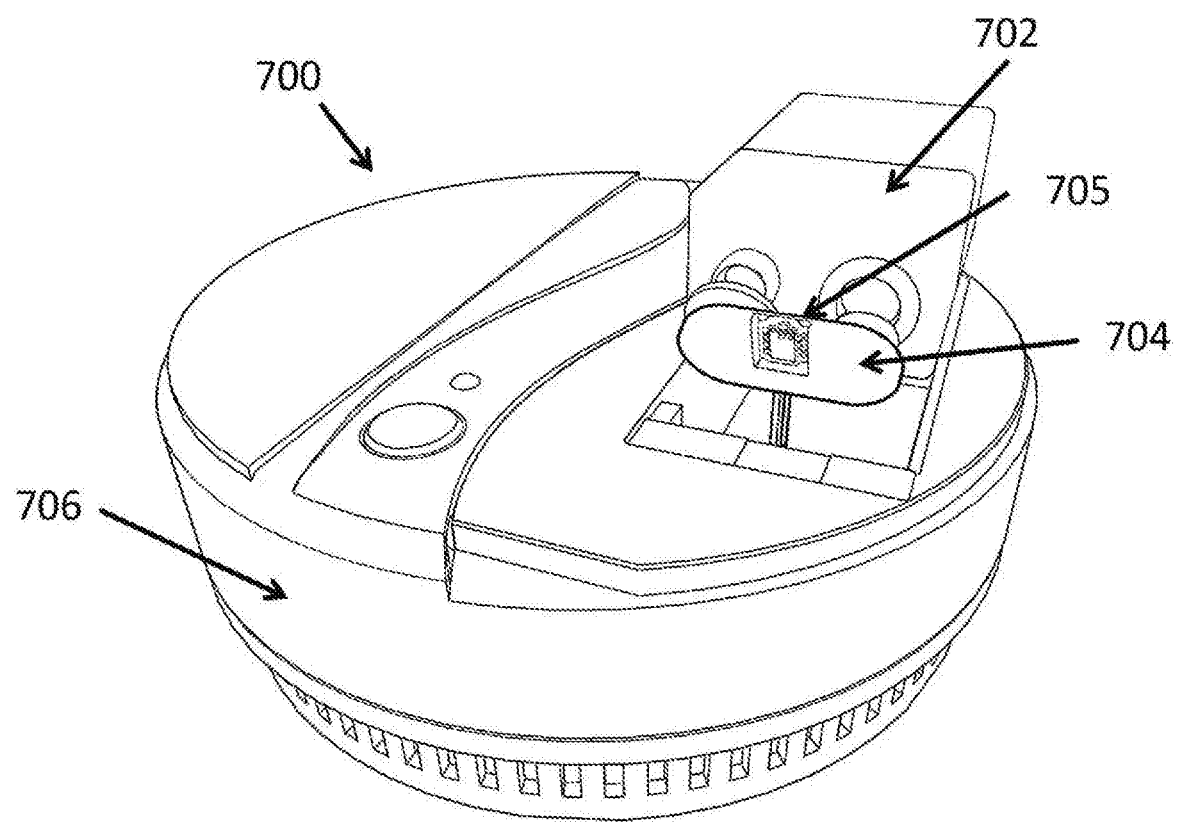
FIG. 5 is a drawing which illustrates a perspective view of an embodiment for a boosting circuit system that is disposed within a 9 Volt battery connector of a smoke detector.

Referring to FIG. 5, in a different embodiment, system 700 to extend battery life is configured to extend battery life of 9V battery 702. In a preferred embodiment, the system comprises a first circuit for operation with the non-depleted 9V battery, a second circuit for operation with the depleted 9V battery using a voltage boosting circuit, and a circuit selector switch for selectively connecting the 9V battery to an electrical load with the first circuit or the second circuit as discussed in the description of FIGS. 1-2, and any other battery boosting circuits, including those taught in U.S. Pat. No. 9,441,799. In this embodiment, components 705 of system 700 are preferably housed inside 9V battery connector 704 permanently attached to the electrical load of 9V battery 702 to power device 706. Optionally, of course, components of an embodiment of the present invention can be disposed in some other part of the device and are not required to be disposed on or in a connector. For example, in one embodiment, components of the present invention can be incorporated into a circuit board of the device such that components of an embodiment of the present invention share a same circuit board with other components of the device.

Figure 6:
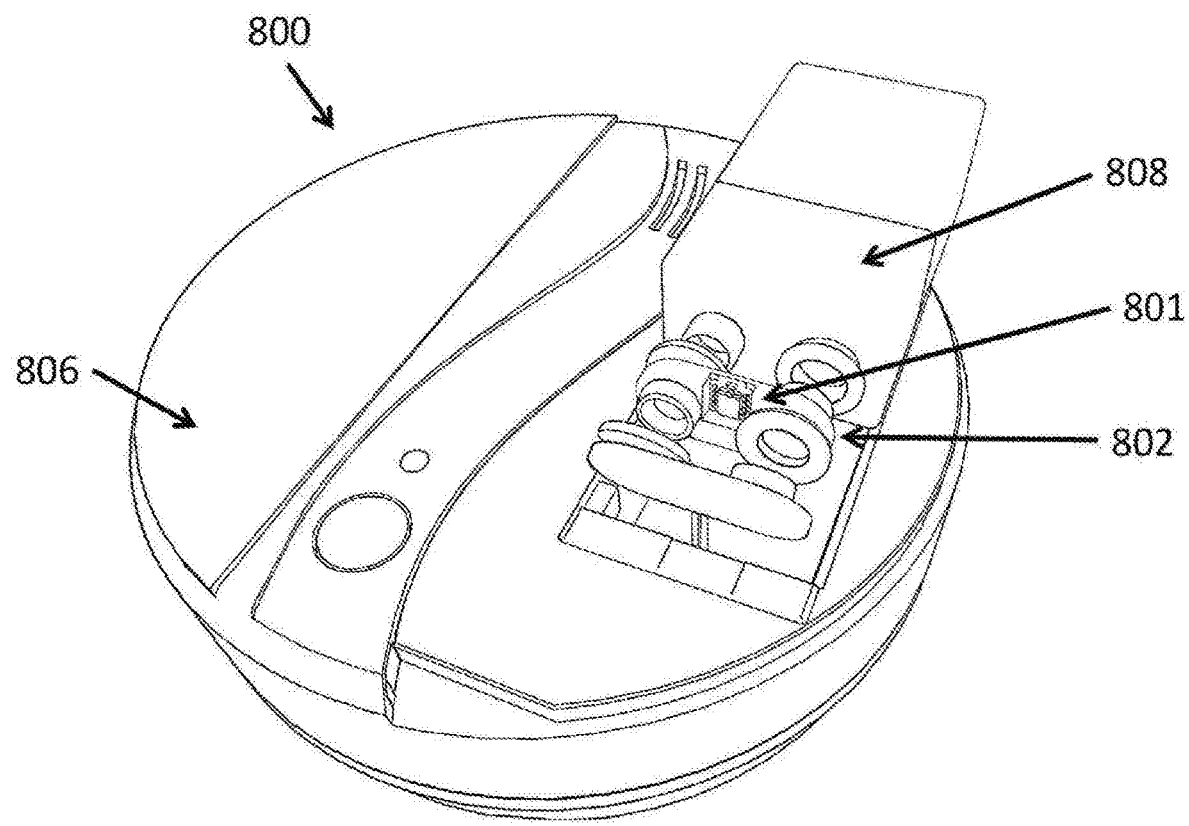
FIG. 6 is a drawing which illustrates a perspective view of an embodiment for a boosting circuit system disposed in a 2-sided 9 Volt battery connector for retrofitting existing 9 Volt battery-operated devices.

Referring now to FIG. 6, in one embodiment, system 800 to extend battery life preferably comprises components 801 housed inside two-sided 9V battery connector 802 to retrofit existing 9V devices, such as device 806 that uses 9V battery 808. In a preferred embodiment, system 800 comprises a first circuit for operation with the non-depleted 9V battery, a second circuit for operation with the depleted 9V battery using a voltage boosting circuit, and one or more circuit selector switches for selectively connecting the 9V battery to an electrical load with the first circuit or the second circuit as previously discussed, and any other battery boosting circuits, including but not limited to those taught in U.S. Pat. No. 9,441,799. As illustrated in FIGS. 5 and 6, the voltage boosting circuit can be connected to a 9-volt battery clip.

Figure 7:
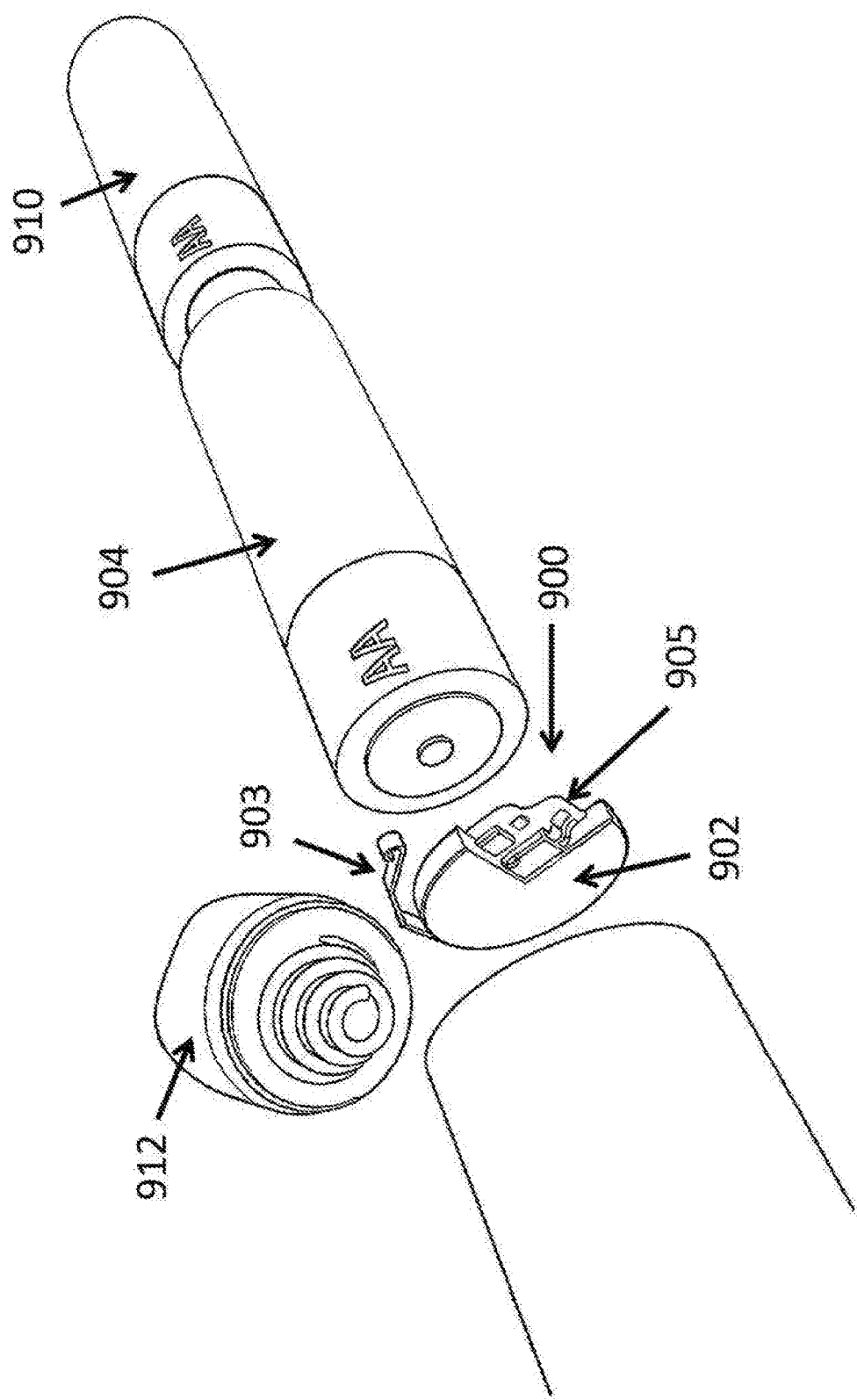
FIG. 7 is a drawing which illustrates a perspective view of an embodiment for a boosting circuit system built in a thin, disc-shaped cap for retrofitting existing battery-operated devices.
Figure 8:
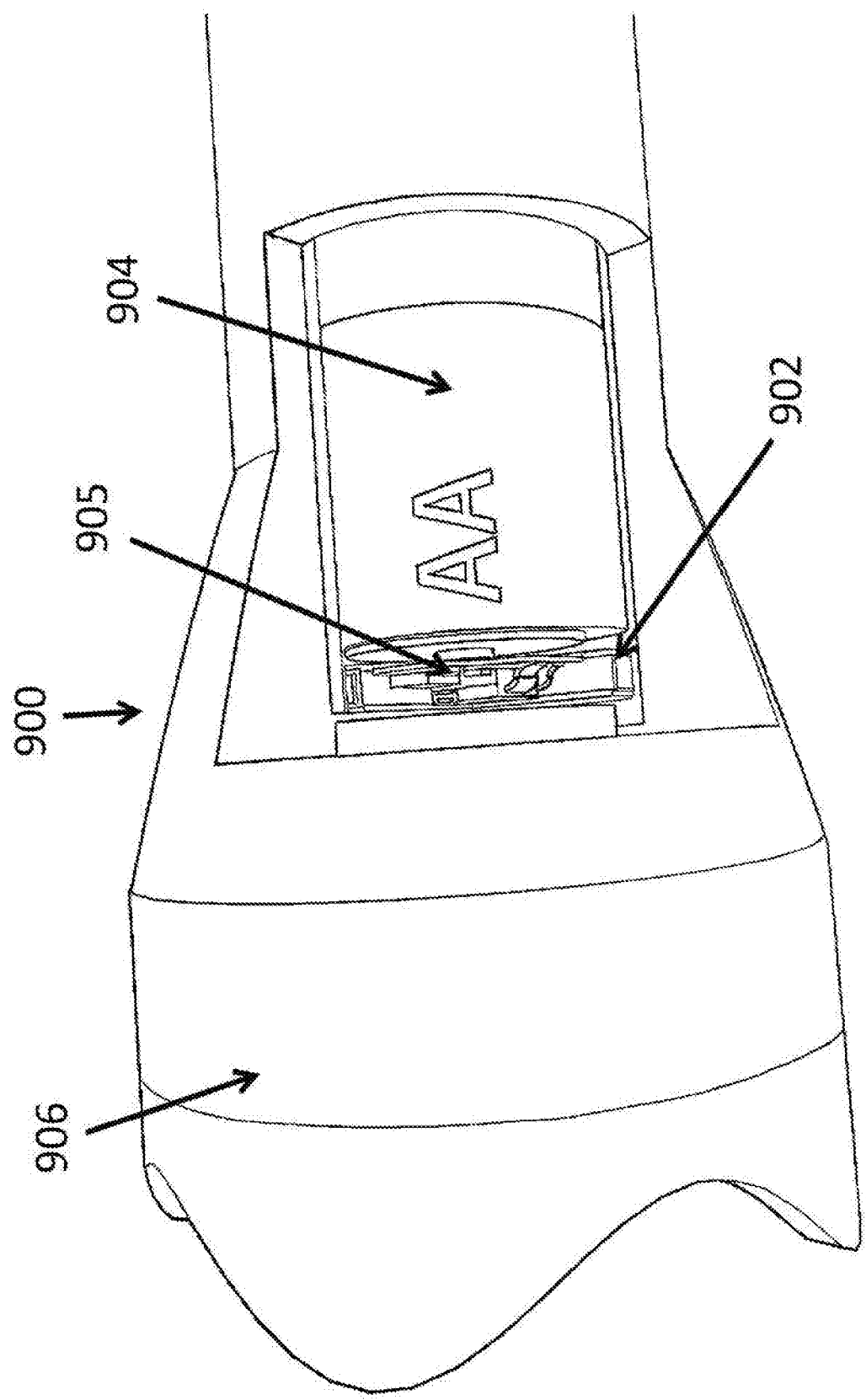
FIG. 8 is a side view drawing of the embodiment of FIG. 7 used to retrofit a flashlight that uses AA batteries with a boosting circuit system according to embodiments of the present invention.

Referring now to FIG. 7, in one embodiment, system 900 to extend battery life is preferably housed in disc (or other) shaped connector 902 for batteries 904 and 910, which can include standardized battery sizes, including but not limited to AA, AAA, C, D, and button cells. In one embodiment, the components of the circuit according to an embodiment of the present invention, are preferably configured to be disposed over one of the two terminals of one or more batteries. As illustrated in FIGS. 7-8, disc shaped connector 902 is placed, for example, over the anode of battery 904 to power, for example, flashlight 906. In one embodiment, disk shaped connector 902 further comprises a conductive tab 903 that is capable of touching, for example, the inner wall of flashlight 906, which is connected to the cathode of battery 910 through battery compartment endcap 912. Conductive tab 903 allows the circuit to be disposed electrically between the battery and the load without requiring a direct connection to both terminals of the battery or battery assembly. In this embodiment, disc shaped connector 902 preferably houses components 905 of the system to extend battery life, which preferably comprise a first circuit for operation with the non-depleted batteries, a second circuit for boosting voltage for operation with the batteries after they become depleted, and a circuit selector switch for selectively connecting the batteries to an electrical load with the first circuit or the second circuit as discussed above, and any other battery boosting circuits, including but not limited to those taught in U.S. Pat. No. 9,441,799.

Embodiments of the present invention can optionally be used for high current applications—which can include, for example, devices with motors and/or screens, including but not limited to cell phones, laptops, drones, starter motors for automobiles, electric vehicles, combinations thereof, and the like.

Figure 9:
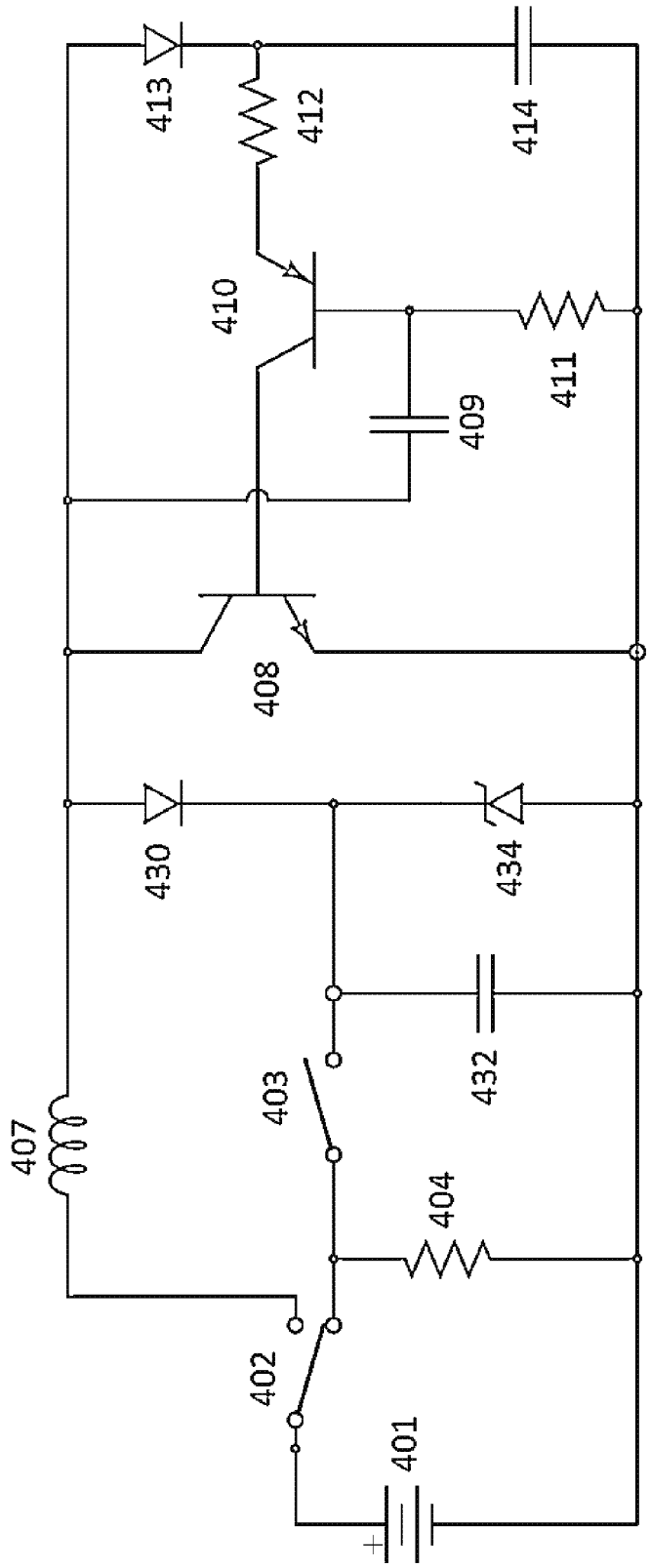
FIG. 9 is a circuit diagram which illustrates a variant of the embodiment of FIG. 1 for a more constant power supply output.

If a more constant power supply output is needed, the output can optionally be regulated with additional voltage and/or current regulating circuitry, which can be desirable for sensitive electronics. One possible configuration, as best illustrated in FIG. 9, comprises, for example, germanium diode 430, which can include but is not limited to a 1N4001, placed between the boosting circuit's positive output and the positive input to the load, capacitor 432, which can include but is not limited to a 47 uF capacitor, placed in parallel with the load, and Zener diode 434, which can include but is not limited to a 1N5229, to regulate the voltage.

In one embodiment, an adaptor housing the system can be provided and can be configured such that it connects magnetically to the batteries or to the device that uses the batteries. Embodiments of the present invention can optionally be made to have a footprint that is smaller than other boosting circuits by being manufactured, for example, within a single microchip package. This compact packaging provides the ability to further reduce manufacturing costs.

Figure 13A:
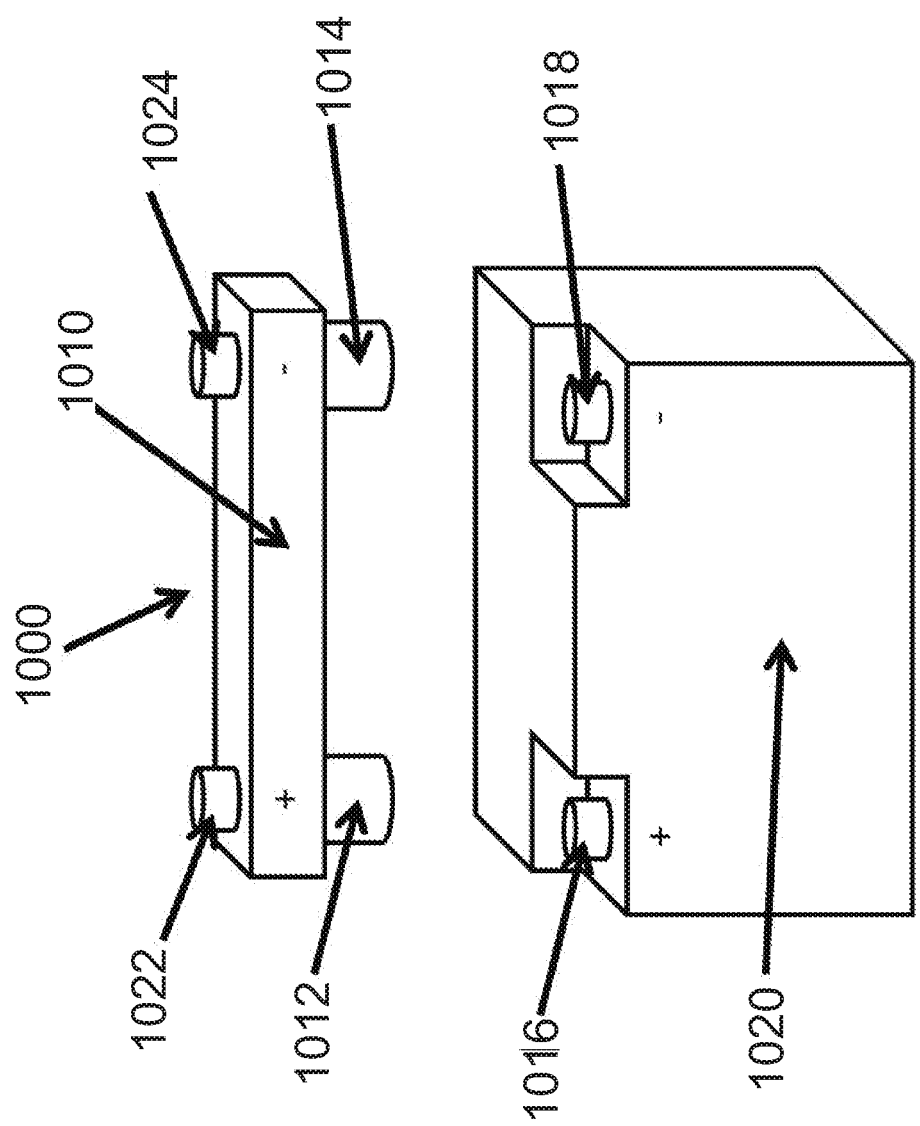
FIGS. 13A and 13B are drawings which respectively illustrate an embodiment of the present invention wherein the voltage-boosting circuit is disposed within a housing having input terminals that are spaced so as to align and make electrical contact with the output terminals of a non-electric vehicle battery.
Figure 13B:
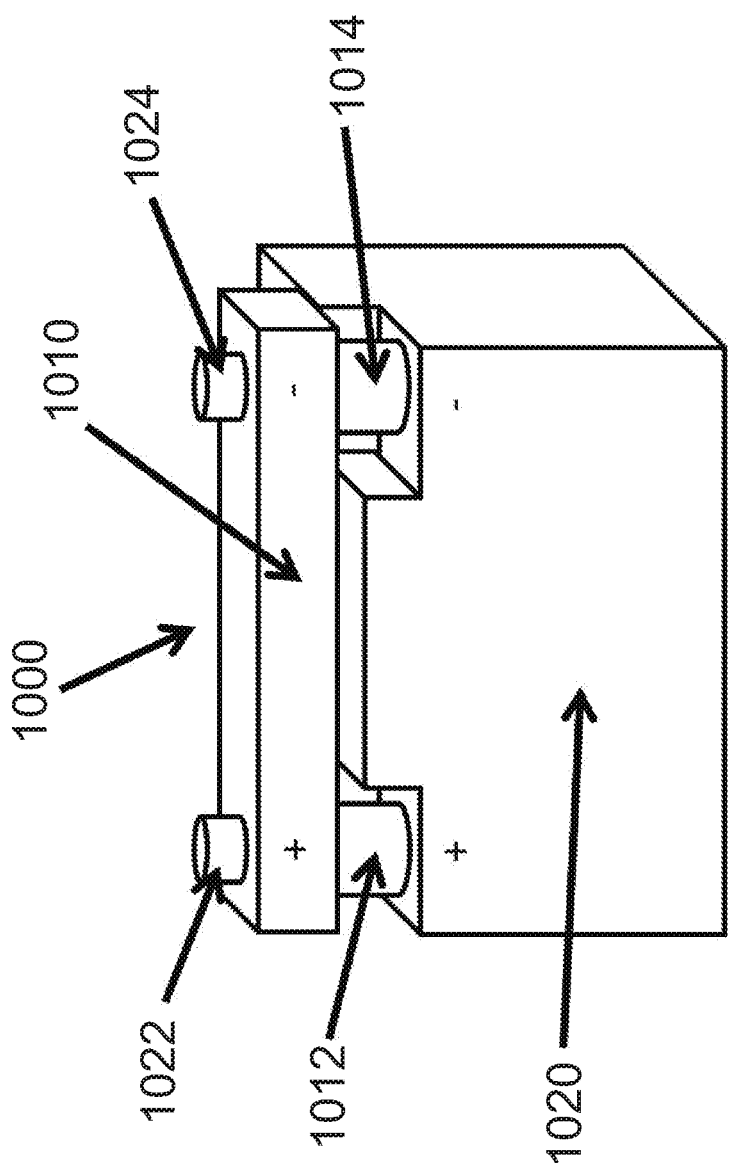

Referring now to FIGS. 13A and 13B, in one embodiment booster clip 1000 can be provided. In this embodiment, a booster circuit can be housed within housing 1010, which is most preferably formed from a non-conductive material. Housing 1010 preferably includes input terminals 1012 and 1014 connected to the boosting circuit. Input terminals 1012 and 1014 are preferably spaced such that they can fit over and/or otherwise make electrical contact with the positive and negative output terminals (1016 and 1018 respectively) of CEV battery 1020, which can be used when a boost of energy is required to start the CEV. In this embodiment, input terminals 1012 and 1014 of the voltage boosting circuit are preferably disposed on a bottom side of the housing and the output terminals of the circuit are preferably disposed on a top side of the housing such that housing 1010, with booster circuit, can be placed atop a CEV battery and the output terminals 1022 and 1024 of the voltage boosting circuit can then be accessible to attach to an automobile. In one embodiment, the CEV battery can be a conventional lead-acid car battery. In one embodiment, the entire assembly of the housing and circuit can be configured to simply clip onto the top of a CEV battery.

Figure 14:
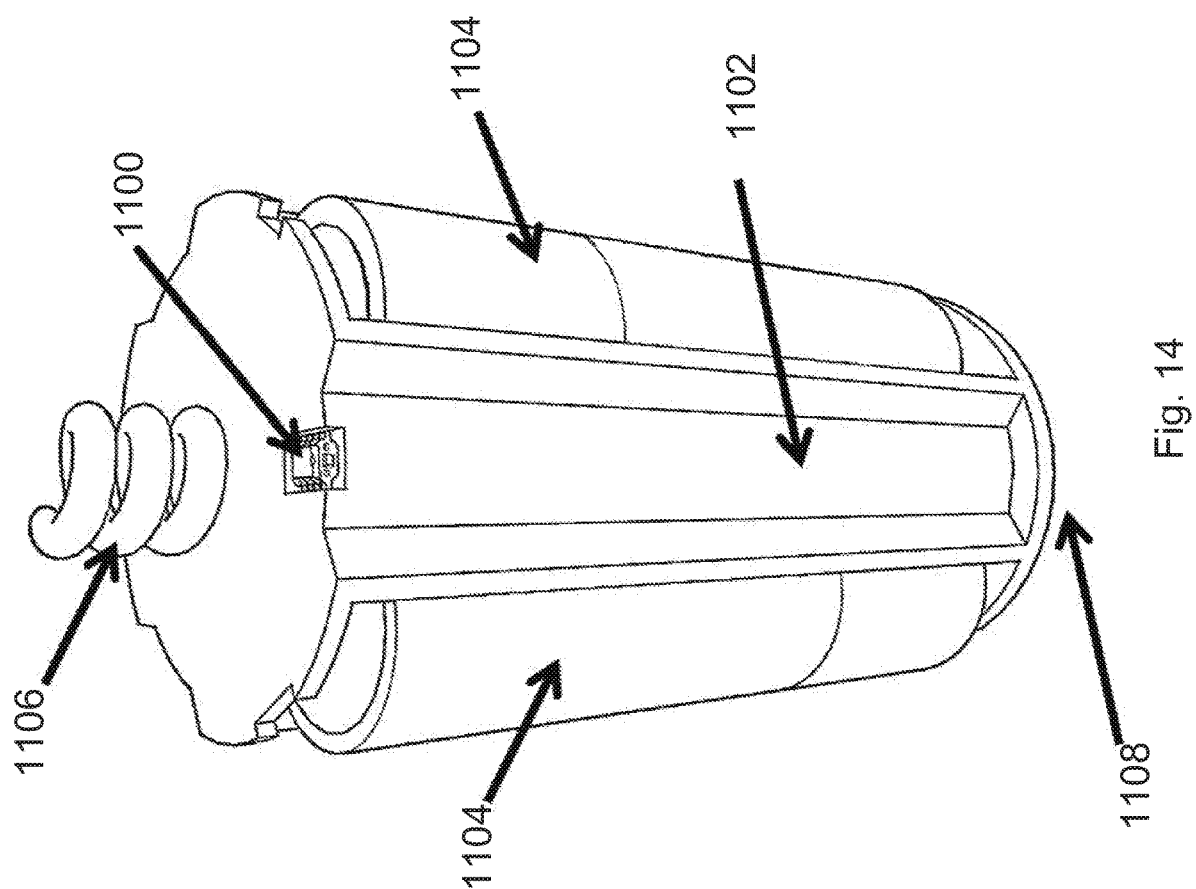
FIG. 14 is a drawing which illustrates a voltage boosting circuit connected to a battery clip.

Referring now to FIG. 14, voltage boosting circuit 1100 can be communicably coupled to or otherwise incorporated into battery clip 1102. Although FIG. 14 illustrates a clip which can hold three batteries 1104, in this embodiment, battery clip 1102 can be configured to hold any desired number of batteries. In this embodiment, positive terminal 1106 and negative terminal 1108 of clip 1102 can be respectively coupled to the positive and negative electrical outputs of voltage boosting circuit 1100, such that the output of the clip can be the output of the voltage boosting circuit 1100. Optionally, the output of the clip can be switched between the battery output and/or the voltage boosting circuit output as previously described in other embodiments. Thus, in one embodiment, voltage boosting circuit and/or a circuit or apparatus for selectively activating the booster circuit can be disposed within a battery clip such that neither the battery nor the circuit for the device that the battery clip connects to needs to be modified to incorporate the voltage boosting circuit.

Embodiments of the present invention allow for boosting of very low voltages to high voltages; maintaining high current throughput, allowing for use in higher-power applications, and do not require a dual-inductor/transformer; thus allowing for a smaller and simpler form than circuits which do require such transformers. For embodiments of the present invention that do not require the components of the present invention to be incorporated into the device, such embodiments permit the use of existing devices with a voltage boosting circuit of the present invention without the necessity of modifying existing devices. For embodiments of the present invention which can be disposed between a battery and an existing circuit, including but not limited to those as illustrated in FIGS. 6 and 7, embodiments of the present invention can be used to enhance battery life without requiring a modification of the existing device or the existing battery. Embodiments of the present invention allow the boosting circuit to be configured into an external connector between the battery and the electronic device being powered.

Because battery-powered devices are often rendered inoperable or less effective when battery voltage drops below a predetermined range and because such batteries still have substantial amounts of energy remaining at voltages that are below that predetermined range, embodiments of the present invention can boost the voltage of that remaining amount of battery energy such that the output voltage is within the predetermined range of the battery-powered device to continue normal operations. Thus, embodiments of the present invention can extend the useful life of batteries for such battery-powered devices.

INDUSTRIAL APPLICABILITY

The invention is further illustrated by the following non-limiting examples.

Example 1

A boosting circuit as illustrated in FIG. 1 was made comprising a 100 µH inductor for 407, a 2SD965 transistor for 408, a 2N3906 transistor for 410, a 1N4148 diode for 413, a 82Ω resistor for 412, a 75 kΩ resistor for 411, a 470 pF capacitor for 409, and a 100 nF capacitor for 414. A source current upwards of 1 amp at 1.5 volts was used. A voltage cutoff threshold was tested by powering a 3 volt LED which had a non-boosted cutoff at 1.75 volts and 0.001 amps. Then, engaging the boosting circuit with these stated components, the circuit used/output the following:

1) Power consumed from source: 1.75 volts and 0.680 amps

2) Output across 3 volt LED: 8.9 volts peak-to-peak at 11.63 kHz

3) Cutoff of the boosting circuit: source was providing 0.25 volts at 0.047 amps with the output across the 3 volt LED at 2.1 volts peak-to-peak at 15.38 kHz Example 2

A boosting circuit as illustrated in FIG. 2 was made comprising a 330 pH inductor for 511, a 2907 transistor for 510, a 2N4401 transistor for 512, a 1 nF capacitor for 508, a 1 kΩ resistor for 509, and a 43 kΩ resistor for 507. A source current upwards of 0.300 amps at 1.5 volts was used. A voltage cutoff threshold was tested by powering a 3 volt LED which has a non-boosted cutoff at 1.75 volts and 0.001 amps. Then, engaging the boosting circuit design with these stated components, the circuit used/output the following:

1) Power consumed from source: 1.75 volts and 0.055 amps

2) Output across 3 volt LED: 3.1 volts peak-to-peak at 19.3 kHz

3) Cutoff of the boosting circuit: source was providing 0.72 volts at 0.005 amps with the output across the 3 volt LED at 2.0 volts peak-to-peak at 142.8 kHz The preceding examples can be repeated with similar success by substituting the generically or specifically described components and/or operating parameters of this invention for those used in the preceding examples. Note that in the specification and claims, if any, "about" or "approximately" means within twenty percent (20%) of the numerical amount cited.

Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguration of their relationships with one another.

What is claimed is:

1. A battery voltage boosting system comprising:
a switch configured to connect a voltage boosting circuit to a battery;
said switch configured to automatically connect said voltage boosting circuit to the battery based on an output voltage of the battery; and
said voltage boosting circuit comprising:
a collector of a PNP transistor coupled to a base of an NPN transistor;
a collector of said NPN transistor coupled to the battery through an inductor when said switch is positioned to connect said voltage boosting circuit to the battery; and
said collector of said NPN transistor coupled to an emitter of said PNP transistor through a resistor and a diode.

2. The battery voltage boosting system of claim 1 wherein said voltage boosting circuit further comprises a capacitor and a Zener diode in parallel with a load when said switch is positioned to connect said voltage boosting circuit to the battery.

3. The battery voltage boosting system of claim 2 wherein said voltage boosting circuit further comprises a germanium diode in series with the load, said capacitor and said Zener diode when said switch is positioned to connect said voltage boosting circuit to the battery.

4. The battery voltage boosting system of claim 1 wherein said voltage boosting circuit comprises a plurality of said voltage boosting circuits and wherein said plurality of voltage boosting circuits are arranged in parallel with one another.

5. The battery voltage boosting system of claim 1 wherein said voltage boosting circuit comprises a plurality of said voltage boosting circuits and wherein said plurality of voltage boosting circuits are connected such that one of said plurality of voltage boosting circuits is connected to cascade in series with another of said plurality of voltage boosting circuits.

6. The battery voltage boosting system of claim 1 wherein said voltage boosting circuit does not comprise a transformer.

7. The battery voltage boosting system of claim 1 wherein said voltage boosting circuit is connected to a battery clip.

8. The battery voltage boosting system of claim 7 wherein said battery clip is a clip that interfaces between the battery and an input terminal for an electrical or electronic device.

9. The battery voltage boosting system of claim 7 wherein said battery clip comprises a 9-volt battery clip.

10. The battery voltage boosting system of claim 1 wherein said voltage boosting system is disposed within a housing of the battery.

11. A battery voltage boosting system comprising:
a switch configured to connect a voltage boosting circuit to a battery;
said voltage boosting circuit comprising:
a collector of a PNP transistor coupled to a base of an NPN transistor;
a collector of said NPN transistor coupled to the battery through an inductor when said switch is positioned to connect said voltage boosting circuit to the battery; and
said collector of said NPN transistor coupled to an emitter of said PNP transistor through a resistor and through said inductor.

12. The battery voltage boosting system of claim 11 wherein said switch is configured to automatically connect said voltage boosting circuit to the battery based on an output voltage of the battery.

13. The battery voltage boosting system of claim 11 wherein said voltage boosting circuit further comprises a capacitor and a Zener diode in parallel with a load when said switch is positioned to connect said voltage boosting circuit to the battery.

14. The battery voltage boosting system of claim 13 wherein said voltage boosting circuit further comprises a germanium diode in series with the load, said capacitor and said Zener diode when said switch is positioned to connect said voltage boosting circuit to the battery.

15. The battery voltage boosting system of claim 11 wherein said inductor is electrically disconnected from said battery when said switch is positioned to disconnect said voltage boosting circuit from the battery.

16. The battery voltage boosting system of claim 11 wherein said voltage boosting circuit does not comprise a transformer.

17. The battery voltage boosting system of claim 11 wherein said voltage boosting circuit is connected to a battery clip.

18. The battery voltage boosting system of claim 17 wherein said battery clip is a clip that interfaces between the battery and an input terminal for an electrical or electronic device.

19. The battery voltage boosting system of claim 17 wherein said battery clip comprises a 9-volt battery clip.

20. The battery voltage boosting system of claim 11 wherein said voltage boosting system is disposed within a housing of the battery.

21. A battery voltage boosting system comprising:
a switch configured to connect a voltage boosting circuit to a battery;
said voltage boosting circuit disposed in a disc-shaped housing; and
said voltage boosting circuit comprising a conductive tab extending from an outer circumference of said disc-shaped housing, said conductive tab comprising a terminal connector of said voltage boosting circuit.

22. The battery voltage boosting system of claim 21 wherein said conductive tab comprises a negative terminal connector of said voltage boosting circuit.

23. The battery voltage boosting system of claim 22 wherein said conductive tab is electrically coupled to an emitter of an NPN transistor without any intervening electronic components.

24. The battery voltage boosting system of claim 21 wherein said conductive tab comprises a positive terminal connector of said voltage boosting circuit.

25. The battery voltage boosting system of claim 21 wherein said disc-shaped housing comprises a diameter not greater than that of an element selected from a list consisting of a AAA-size battery, a AA-size battery, a C-size battery, and a D-size battery.

26. A method for boosting a battery voltage comprising:
sensing an output voltage of a battery;
activating a switch if the output voltage of the battery falls below a predetermined amount;
boosting voltage by passing current through an inductor and through a collector and an emitter of a first NPN transistor when the switch is activated; and
controlling the NPN transistor by adjusting a voltage applied to a base of the NPN transistor from a collector of a PNP transistor.

27. The method of claim 26 wherein sensing an output voltage of the battery and activating the switch are accomplished electronically.

28. The method of claim 26 wherein boosting voltage does not comprise boosting voltage via a transformer.

29. The method of claim 26 wherein the method includes boosting voltage by cascading an output of a first voltage boosting circuit into an input of a second voltage boosting circuit.

30. The method of claim 26 wherein the method includes extending life of the battery by boosting a remaining unused energy of the battery that otherwise would not be useable.

31. A battery voltage boosting system comprising:
a switch configured to connect a voltage boosting circuit to a battery; and
said voltage boosting circuit comprising:
a collector of a PNP transistor coupled to a base of an NPN transistor;
a collector of said NPN transistor coupled to the battery through an inductor when said switch is positioned to connect said voltage boosting circuit to the battery;
said collector of said NPN transistor coupled to an emitter of said PNP transistor through a resistor and a diode; and
a capacitor and a Zener diode in parallel with a load when said switch is positioned to connect said voltage boosting circuit to the battery.

32. A battery voltage boosting system comprising:
a switch configured to connect a voltage boosting circuit to a battery;
said voltage boosting circuit connected to a battery clip; and
said voltage boosting circuit comprising:
a collector of a PNP transistor coupled to a base of an NPN transistor;
a collector of said NPN transistor coupled to the battery through an inductor when said switch is positioned to connect said voltage boosting circuit to the battery; and
said collector of said NPN transistor coupled to an emitter of said PNP transistor through a resistor and a diode.

33. The battery voltage boosting system of claim 32 wherein said battery clip is a clip that interfaces between the battery and an input terminal for an electrical or electronic device.

* * * * *